(12) United States Patent
Takayanagi et al.

(10) Patent No.: US 7,477,003 B2
(45) Date of Patent: Jan. 13, 2009

(54) BIMORPH ELEMENT, BIMORPH SWITCH, MIRROR ELEMENT, AND METHOD FOR MANUFACTURING THESE

(75) Inventors: Fumikazu Takayanagi, Tokyo (JP); Hirokazu Sanpei, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/681,038

(22) Filed: Mar. 1, 2007

(65) Prior Publication Data
US 2007/0194656 A1 Aug. 23, 2007

Related U.S. Application Data

(63) Continuation of application No. PCT/JP2005/015928, filed on Aug. 31, 2005.

(30) Foreign Application Priority Data
Sep. 1, 2004 (JP) .............................. 2004-254810

(51) Int. Cl.
*H01L 41/08* (2006.01)
(52) U.S. Cl. ...................... 310/330; 310/331
(58) Field of Classification Search ................. 310/324, 310/330–332
See application file for complete search history.

(56) References Cited

U.S. PATENT DOCUMENTS 6,080,988 A * 6/2000 Ishizuya et al. .......... 250/338.1
6,791,233 B2 * 9/2004 Tomonari et al. ........... 310/307
2001/0009344 A1 * 7/2001 Furukawa et al. ........... 310/358
2004/0160302 A1 * 8/2004 Yasuoka et al. ............. 337/333

FOREIGN PATENT DOCUMENTS

| EP | 1011130 | 6/2000 |
|---|---|---|
| JP | 07-128365 | 5/1995 |
| JP | 2000-124251 | 4/2000 |
| JP | 2001-023497 | 1/2001 |
| JP | 2001-168406 | 6/2001 |
| JP | 2002-289642 | 10/2002 |
| JP | 2003-061798 | 3/2003 |
| JP | 2004-055410 | 2/2004 |
| JP | 2004-254810 | 9/2004 |
| WO | WO03060592 | 7/2003 |
| WO | WO 2004024618 | 3/2004 |

\* cited by examiner

*Primary Examiner*—Mark Budd
(74) *Attorney, Agent, or Firm*—Osha • Liang LLP

(57) ABSTRACT

There is provided a bimorph element including a silicon oxide layer, a high expansion coefficient layer that is formed on the silicon oxide layer and has a thermal expansion coefficient higher than a thermal expansion coefficient of the silicon oxide layer, and a deformation preventing film that covers a surface of the silicon oxide layer and prevents the silicon oxide layer from being deformed over time. The deformation preventing film has a transmission factor of moisture and oxygen lower than that of the silicon oxide layer. The deformation preventing film is a silicon oxide film that is formed with energy higher than that used in a case that forms the silicon oxide layer. The deformation preventing film is a silicon nitride film or a metallic film.

8 Claims, 4 Drawing Sheets

BIMORPH ELEMENT, BIMORPH SWITCH, MIRROR ELEMENT, AND METHOD FOR MANUFACTURING THESE

BACKGROUND

1. Field of the Invention

The present invention relates to a bimorph element, a bimorph switch, a mirror element including the bimorph element, and a method for manufacturing these. The present application also relates to the following application, the contents of which are incorporated herein by reference if applicable.

A Japanese Patent Application No. 2004-254810 Filed on Sep. 1, 2004.

2. Related Art

Bimorph switches have been recently known as an example of micro devices that are manufactured by a semiconductor process. The bimorph switches have two layers with a different thermal expansion coefficient, and are bent by means of heating these layers by the heater. Since a traveling contact is provided on the bent portion and a fixed contact is provided at a position facing the traveling contact, a switch for switching ON and OFF for electric connection can be formed, as disclosed, for example, in Japanese Patent Application Publication No. 2004-55410 and WO2004/024618.

However, in a bimorph element such as bimorph switches, since internal stress of a silicon oxide layer constituting one side of two layers changes over time, there has been a problem that the shape of element changes over time. For this reason, there has been a problem that input power to give desired displacement to the bimorph element is different every device.

SUMMARY

Therefore, it is an object of some aspects of the present invention to provide a bimorph element, a bimorph switch, a mirror element, and a method for manufacturing these that can solve the foregoing problems. The above and other objects can be achieved by combinations described in the independent claims. The dependent claims define further advantageous and exemplary combinations of the present invention.

To solve this problem, according to the first aspect of the present invention, there is provided a bimorph element. The bimorph element includes: a silicon oxide layer; a high expansion coefficient layer that is formed on the silicon oxide layer and has a thermal expansion coefficient higher than a thermal expansion coefficient of the silicon oxide layer; and a deformation preventing film that covers a surface of the silicon oxide layer and prevents the silicon oxide layer from being deformed over time.

The deformation preventing film may have a transmission factor of moisture and oxygen lower than that of the silicon oxide layer. The deformation preventing film may be a silicon oxide film that is formed with energy higher than that used in a case that forms the silicon oxide layer. The deformation preventing film may be a silicon nitride film. The deformation preventing film may be a metallic film. The high expansion coefficient layer may consist of copper.

According to the second aspect of the present invention, there is provided a bimorph switch including a circuit substrate and a bimorph element. The circuit substrate has a fixed contact thereon, the bimorph element includes: a silicon oxide layer; a high expansion coefficient layer that is formed on the silicon oxide layer and has a thermal expansion coefficient higher than a thermal expansion coefficient of the silicon oxide layer; a deformation preventing film that covers a surface of the silicon oxide layer and prevents the silicon oxide layer from being deformed over time; a heater that heats the high expansion coefficient layer and the silicon oxide layer; and a traveling contact that is provided opposite the fixed contact, and the traveling contact is electrically connected to the fixed contact when the heater heats the high expansion coefficient layer and the silicon oxide layer.

According to the third aspect of the present invention, there is provided a mirror element including a bimorph element. The bimorph element includes: a silicon oxide layer; a high expansion coefficient layer that is formed on the silicon oxide layer and has a thermal expansion coefficient higher than a thermal expansion coefficient of the silicon oxide layer; a deformation preventing film that covers a surface of the silicon oxide layer and prevents the silicon oxide layer from being deformed over time; a heater that heats the high expansion coefficient layer and the silicon oxide layer; and a mirror that reflects light, the mirror being provided at a position of which a direction is changed on a surface of the bimorph element when the heater heats the high expansion coefficient layer and the silicon oxide layer.

According to the fourth aspect of the present invention, there is provided a method for manufacturing a bimorph element including a silicon oxide layer and a high expansion coefficient layer formed on the silicon oxide layer. The method includes: forming the high expansion coefficient layer having a thermal expansion coefficient higher than a thermal expansion coefficient of the silicon oxide layer; forming the silicon oxide layer on the high expansion coefficient layer; and forming a deformation preventing layer that covers a surface of the silicon oxide layer and prevents the silicon oxide layer from being deformed over time.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Embodiment 1

Figure 1:
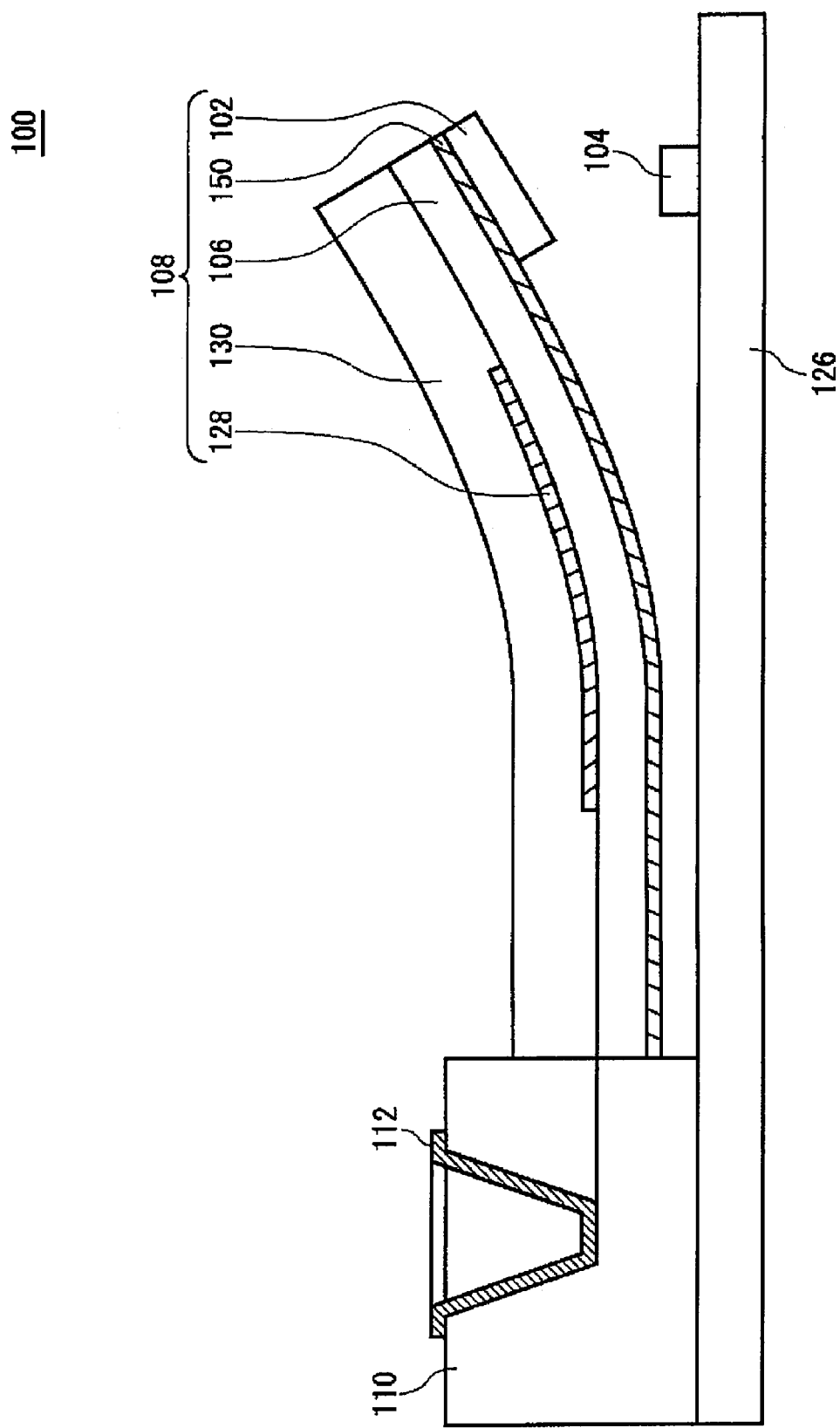
FIG. 1 is a sectional view of a bimorph switch 100 according to the first embodiment of the present invention.
Figure 2:
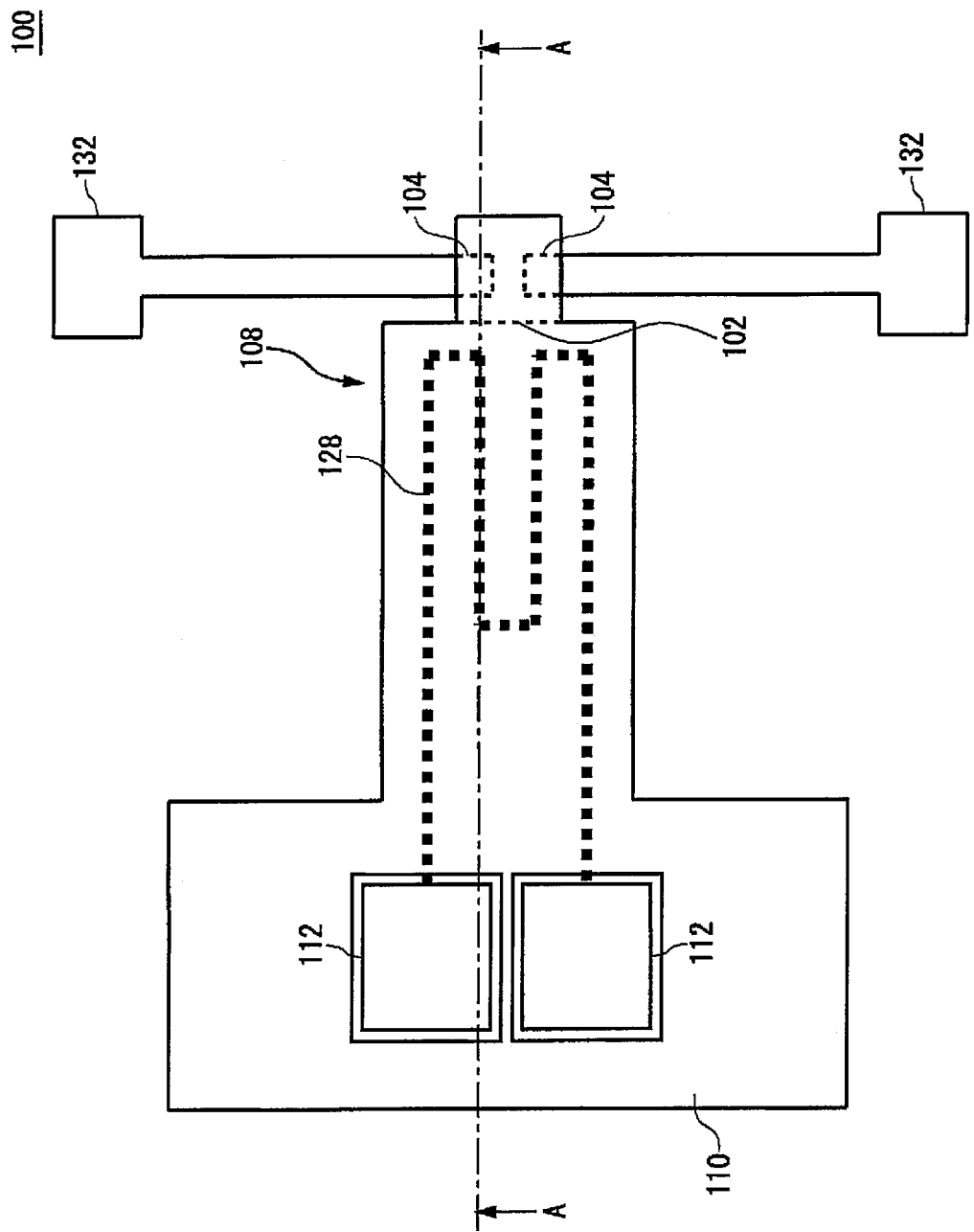
FIG. 2 is a view that is viewed from above a bimorph switch 100 shown in FIG. 1.

FIG. 1 is a sectional view of a bimorph switch 100 according to the first embodiment of the present invention. Moreover, FIG. 2 is a view that is viewed from above the bimorph switch 100 shown in FIG. 1. A sectional view of FIG. 1 corresponds to an A-A cross section of FIG. 2. The bimorph switch 100 is, e.g., a cantilever shape, that is, a cantilevershaped switch. The bimorph switch 100 includes a substrate 126, a bimorph portion 108, and a supporting portion 110. The bimorph portion 108 is an example of a bimorph element of the present invention. The supporting portion 110 is fixed to the substrate 126 and supports one end of the bimorph portion 108. The substrate 126 is, e.g., a glass substrate. The substrate 126 may be a silicon substrate. The bimorph switch 100 of the present embodiment has features that the shape of the bimorph portion 108 does not change over time at room temperature.

The bimorph portion 108 has a fixed end supported by the supporting portion 110 and a free end elongated from the fixed end. The bimorph portion 108 bends upward as it goes from the fixed end to the free end. The bimorph portion 108 includes a silicon oxide layer 106, a high expansion coefficient layer 130 that is formed on the silicon oxide layer 106 and has a thermal expansion coefficient higher than a thermal expansion coefficient of the silicon oxide layer 106, and a deformation preventing layer 150 that covers a surface of the silicon oxide layer 106 and has a transmission factor of moisture and oxygen smaller than that of the silicon oxide layer 106. The high expansion coefficient layer 130 is formed of metal such as copper or aluminum.

The bimorph portion changes over time due to two prominent factors. The first factor is deformation of the silicon oxide layer according to the fact that an unreacted portion of the silicon oxide layer is oxidized and swelled. The second factor is deformation of the bimorph portion according to the fact that internal stress mitigates over time when the high expansion coefficient layer is metal. An object of the present embodiment is to prevent a shape of bimorph from being changed over time in accordance with the above two factors.

The deformation preventing layer 150 is a silicon nitride film. Silicon nitride can form a film finer than silicon oxide and thus more surely block moisture and oxygen. Alternatively, the deformation preventing layer 150 may be a silicon oxide film that is formed with energy higher than that used in a case that forms the silicon oxide layer 106. Since the fineness of the formed silicon oxide film increases by means of raising energy when forming the silicon oxide film, it is possible to more surely block moisture and oxygen. In this case, manufacturing of the bimorph portion 108 is easy because a film of the deformation preventing layer 150, can be formed of the same materials as those of the silicon oxide layer 106. In this manner, since the bimorph portion 108 has the deformation preventing layer 150, it is possible to prevent the silicon oxide layer 106 from being expanded over time. Therefore, the shape of the bimorph portion 108 can be maintained with higher precision.

The bimorph portion 108 further has a traveling contact 102 and a heater 128. The traveling contact 102 is provided on a lower face, that is, a face facing the substrate 126 in a leading end of the bimorph portion 108. The heater 128 is an electric conductor that is formed to efficiently heat the high expansion coefficient layer 130 and the silicon oxide layer 106. For example, the heater 128 is provided between the high expansion coefficient layer 130 and the silicon oxide layer 106 substantially in parallel with them. When the high expansion coefficient layer 130 is an electric conductor such as metal, the high expansion coefficient layer 130 is insulated from the heater 128 by means of covering a periphery of the heater 128 with an insulating material such as silicon oxide. On the other hand, the substrate 126 has a fixed contact 104 at a position facing the traveling contact 102. The bimorph portion 108 holds the traveling contact 102 away from the fixed contact 104 by a certain distance at normal temperature. According to the present embodiment, the length of the bimorph portion 108 is about 600 μm and the height from a central portion of the traveling contact 102 to the fixed contact 104 is about 50 μm.

A heater electrode 112 is a metal electrode electrically connected to the heater 128. The high expansion coefficient layer 130 and the silicon oxide layer 106 are substantially simultaneously heated when electric power is supplied to the heater 128 via the heater electrode 112. According to this, the high expansion coefficient layer 130 is extended largely than the silicon oxide layer 106, and thus the bimorph portion 108 is deformed in a direction in which an amount of curvature of the bimorph portion 108 decreases. Hereby, the bimorph portion 108 causes the traveling contact 102 to touch the fixed contact 104. According to this, the traveling contact 102 and the fixed contact 104 are electrically connected to each other. The traveling contact 102 and the fixed contact 104 correspond to a contact point for a switch in case of the bimorph switch 100. The traveling contact 102 and the fixed contact 104 are formed of metal such as platinum or gold.

In the embodiment, the supporting portion 110 is a silicon oxide layer formed on the surface of the substrate 126. In the embodiment, the supporting portion 110 supports only one end of the bimorph portion 108. In another embodiment, the supporting portion 110 may support both ends of the bimorph portion 108.

In addition, the high expansion coefficient layer 130 may be a deposition hardening type alloy such as titanium copper and beryllium copper. Since a deposition hardening type copper alloy such as titanium copper and beryllium copper is superior to a stress relaxation characteristic, the copper alloy has small distortion caused by the deformation of the bimorph portion 108. Therefore, the copper alloy has an effect that the shape of the bimorph portion 108 is hard to change over time.

FIG. 2 shows a top view of the bimorph switch l00. In the embodiment, the bimorph switch 100 includes a plurality of fixed contacts 104. In the bimorph switch 100, the plurality of fixed contacts 104 are electrically connected to one another by means of electrically connecting each of the plurality of fixed contacts 104 and the traveling contact 102 described with reference to FIG. 1. The bimorph switch 100 is a bimorph switch with two contact points for connecting and blocking signals between the plurality of fixed contacts 104. The bimorph switch 100 connects and blocks signals between the plurality of fixed contacts 104. Moreover, the bimorph switch 100 further includes a plurality of fixed contact electrodes 132 corresponding to the plurality of fixed contacts 104. Each of the plurality of fixed contact electrodes 132 is an electrode corresponding to each of the plurality of fixed contacts 104. The fixed contact electrode 132 is electrically connected to the corresponding fixed contact 104. The fixed contact electrode 132 is integrated with the corresponding fixed contact 104.

An example of a method for manufacturing the bimorph portion 108 will be below explained. A manufacturing method of the bimorph portion 108 includes a high expansion coefficient layer forming step, an annealing step, a heater forming step, a silicon oxide layer forming step, a deformation preventing layer forming step, a traveling contact forming step, and a sacrifice layer removing step. First, in the high expansion coefficient layer forming step, the high expansion coefficient layer 130 is formed by means of depositing, by sputtering, metal such as copper and aluminum on a sacrifice layer consisting of, e.g., silicon oxide at normal temperature.

Next, in the annealing step, the high expansion coefficient layer 130 formed on the sacrifice layer is annealed. Internal stress generated at the time of deposition by sputtering remains behind in the high expansion coefficient layer 130 formed on the sacrifice layer. Thus, this internal stress is mitigated by annealing. The temperature of annealing is set to temperature higher than recrystallization temperature of metal forming the high expansion coefficient layer 130 and plasma CVD temperature to be described below. For example, when using copper as materials of the high expansion coefficient layer 130, annealing temperature is set to about 400 degrees Celsius. Moreover, when using aluminum as materials of the high expansion coefficient layer 130, annealing temperature is set to about 350 degrees Celsius. It is suitable that annealing time is around 15 minutes.

By means of this annealing, recrystallization of atoms of the high expansion coefficient layer 130 is performed and defect between lattices decreases. According to this, internal stress of the high expansion coefficient layer 130 is mitigated, and thus one of the factors by which the shape of the bimorph portion 108 changes over time can be removed. Moreover, since internal stress of the high expansion coefficient layer 130 is mitigated in this annealing step, the deformation of the high expansion coefficient layer 130 can be prevented when the layer is exposed to around 300 degree temperature under plasma CVD in the following silicon oxide layer forming step. Therefore, an early curvature amount when manufacturing the bimorph portion 108 can be managed with high precision by means of wattage when layering the silicon oxide layer 106 under CVD.

Next, in the heater forming step, an insulating layer is first formed on the surface of the high expansion coefficient layer 130. The insulating layer is formed by means of depositing silicon oxide under CVD, for example. Then, the heater 128 is formed by means of depositing metal such as platinum by sputtering at room temperature. Next, in the silicon oxide layer forming step, silicon oxide is deposited on a top face of the insulating layer and the heater 128, which is formed in the heater forming step, under plasma CVD making use of TEOS (Tetraethoxysilane). In the silicon oxide layer forming step of the present embodiment, the silicon oxide layer 106 is formed by depositing silicon oxide in a state that the output of plasma CVD is regulated to, e.g., 130 watts and 300 degrees Celsius. In addition, when the high expansion coefficient layer 130 is metal, it is desirable that a chrome layer and a titanium layer are formed on the high expansion coefficient layer 130 in this order and then the silicon oxide layer 106 is formed thereon. According to this, adhesion intensity between the silicon oxide layer 106 and the high expansion coefficient layer 130 is improved.

Next, in the deformation preventing layer forming step, the deformation preventing layer 150 is formed by depositing silicon nitride on the surface of the silicon oxide layer 106 under plasma CVD. Alternatively, the deformation preventing layer 150 may be formed by means of depositing silicon oxide under plasma CVD using energy higher than that used in the silicon oxide layer forming step. When forming the deformation preventing layer 150 using silicon oxide, the deformation preventing layer 150 is formed by depositing silicon oxide in a state that the output of plasma CVD is regulated to, e.g., 150 watts. Since silicon oxide is deposited under plasma CVD using energy higher than that used in the silicon oxide layer forming step, silicon oxide in the deformation preventing layer 150 forms a film finer than silicon oxide in the silicon oxide layer 106.

Next, in the traveling contact forming step, the traveling contact 102 is formed by means of depositing metal such as gold with high corrosion resistance on the surface of the deformation preventing layer 150, e.g., using sputtering and removing metal in a range excepting the traveling contact 102 using etching. Finally, in the sacrifice layer removing step, the sacrifice layer supporting the high expansion coefficient layer 130 is removed using etching. Then, the bimorph portion 108 is curved toward the high expansion coefficient layer 130 in accordance with an internal stress difference between the silicon oxide layer 106 and the high expansion coefficient layer 130. The size of curvature at this time is determined by the size of energy, that is, the size of wattage of plasma CVD in the silicon oxide layer forming step. An amount of curvature of the bimorph portion 108 becomes large as the wattage of plasma CVD increases. An amount of curvature appropriate to the bimorph portion 108 of the present embodiment is obtained by regulating the output of plasma CVD in the silicon oxide layer forming step to around 130 watts as described above. The bimorph portion 108 shown in FIG. 1 is obtained by means of up and down reversing the bimorph portion 108 obtained in this way.

Since the deformation preventing layer 150 consisting of silicon nitride forms a film finer than silicon oxide, the deformation preventing layer 150 can more surely block moisture and oxygen. Moreover, since the deformation preventing layer 150, which is formed by depositing silicon oxide under plasma CVD using energy higher than that used in the silicon oxide layer forming step, has a film finer than silicon oxide of the silicon oxide layer 106, the deformation preventing layer 150 blocks moisture and oxygen from the silicon oxide layer 106. In this case, manufacturing is easy because a film of the deformation preventing layer 150 can be formed of the same materials as those of the silicon oxide layer 106.

In other words, since the bimorph switch 100 has the deformation preventing layer 150, it is possible to prevent the silicon oxide layer 106 from being expanded according to variation per hour. According to this, the shape of the bimorph portion 108 is maintained with high precision, and thus a contact gap between the fixed contact 104 and the traveling contact 102 is stable. Therefore, all of electric power to be input into the heater 128 in order to change a switch and a response speed of switching are stable. In addition, the bimorph element. of the present invention may be a micromachine such as a microsensor.

Embodiment 2

Figure 3A:
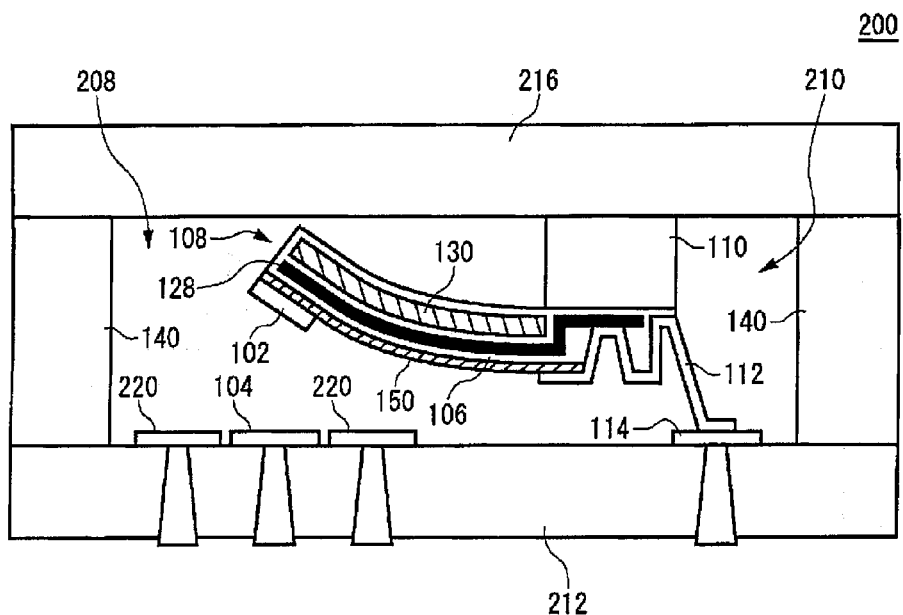
FIGS. 3A and 3B are sectional views of a microswitch 200 according to the second embodiment of the present invention.
Figure 3B:
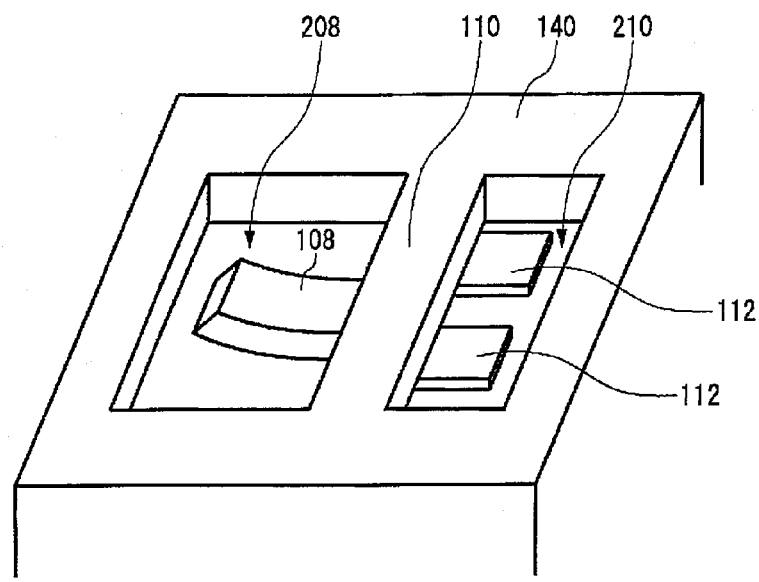

FIGS. 3A and 3B show a configuration of a microswitch 200 according to the second embodiment of the present embodiment. FIG. 3A shows a sectional view of the microswitch 200 and FIG. 3B shows a perspective view of a substrate 140 in a state that the substrate 216 is detached from the microswitch 200. The microswitch 200 is an example of the bimorph switch according to the present invention. In this embodiment, components similar to those of the first embodiment have the same reference numbers, and their descriptions are omitted.

The microswitch 200 is manufactured through a semiconductor process and is electrically connected to an outside to operate appropriately. The microswitch 200 includes a substrate 140 through which through-holes 208 and 210 are formed, a bimorph portion 108 of which one end is adhered to a supporting portion 110 and the other end is freely held within the through-hole 208, a wiring substrate 212 that is provided substantially in parallel with the substrate 140 away from the bimorph portion 108, a fixed contact 104 and an electrode pad 114 that are provided in the wiring substrate 212, a conductive heater electrode 112 of which one end is adhered to the substrate 140 and the other end is elongated in a direction of the through-hole 210 and is curved in an outersurface direction of the substrate 140 so as to be electrically connected to the electrode pad 114, a substrate 216 that is provided on a top face of the substrate 140, and a ground electrode 220 that is provided in the wiring substrate 212. The supporting portion 110 is a part of the substrate 140. The substrate 216 is provided to seal up the through-holes 208 and 210 along with the wiring substrate 212. The through-hole 208 and through-hole 210 are formed by means of removing a part of the substrate 140 from the top face of the substrate 140. Moreover, the wiring substrate 212 is provided at the side facing the lower face of the substrate 140. The ground electrode 220 is provided in the close vicinity of the fixed contact 104.

The bimorph portion 108 of the present embodiment covers, with silicon oxide, a periphery of the high expansion coefficient layer 130 and the heater 128 consisting of, e.g., copper. Therefore, the high expansion coefficient layer 130 and the heater 128 are provided to be faced substantially in parallel with each other in a state that that are insulated by silicon oxide. A silicon oxide layer 106 is formed on a lower face of the heater 128. A deformation preventing layer 150 consisting of silicon nitride is provided on a surface of a silicon oxide layer 106. Alternatively, the deformation preventing layer 150 may be formed by means of depositing silicon oxide under plasma CVD using energy higher than that used in the silicon oxide layer 106. Moreover, the deformation preventing layer 150 may be formed with metal. Moreover, the deformation preventing layer 150 may be formed as a semiconductor film such as silicon or silicon carbide, or may be formed as a polymer molecule film.

A traveling contact 102 is provided opposite the fixed contact 104 on a lower face of a leading end of the bimorph portion 108. The heater electrode 112 and the electrode pad 114 are electrically connected to each other in the central vicinity of the through-hole 210. The heater electrode 112 is connected to the heater 128 and supplies electric power heating the heater 128. The microswitch 200 shown by the present embodiment can be, for example, manufactured by means of combining a manufacturing method disclosed in WO2004/024618 and a manufacturing method of the bimorph portion 108 described in FIG. 1. Since the microswitch 200 of the present embodiment has the deformation preventing layer 150 on the surface of the silicon oxide layer 106 in the bimorph portion 108, it is possible to prevent the silicon oxide layer 106 from being expanded according to variation per hour. Therefore, the shape of the bimorph portion 108 is hard to change over time at room temperature. According to this, it is possible to reduce fluctuation of input power every device, in which the input power is necessary to give desired displacement to the bimorph portion 108.

Embodiment 3

Figure 4:
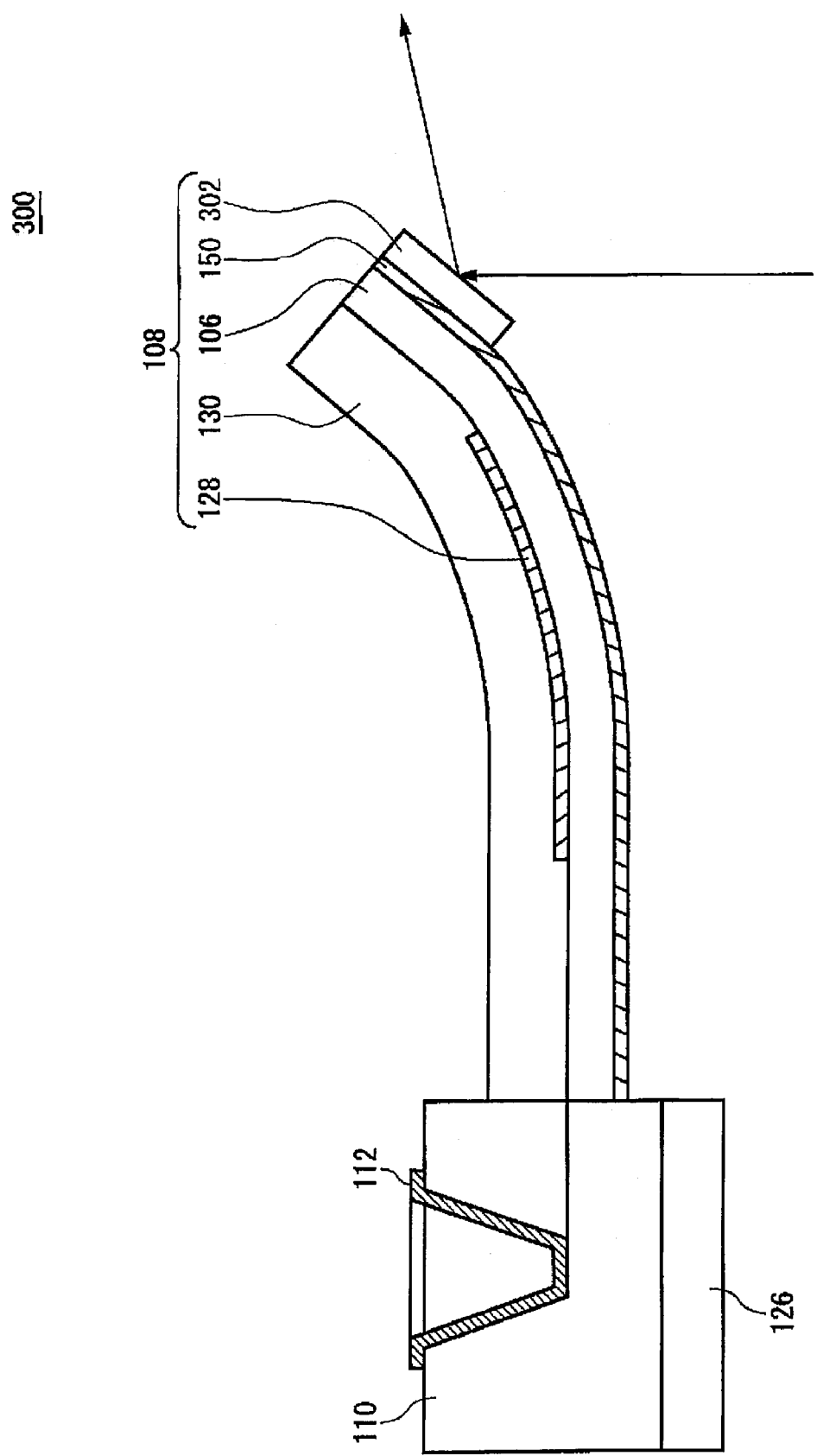
FIG. 4 is a sectional view of a mirror element 200 according to the third embodiment of the present invention.

FIG. 4 shows an example of a sectional view of a mirror element 300 according to the third embodiment of the present invention. Hereinafter, components similar to those of the first embodiment have the same reference numbers, and their descriptions are omitted. The mirror element 300 of the present embodiment has a mirror 302 in place of the traveling contact 102 and the fixed contact 104 as described above unlike the first embodiment. The mirror 302 is formed in the vicinity of a leading end of a free end side of the bimorph portion 108. For example, the mirror element 300 shown in FIG. 4 has the mirror 302 on the surface of the deformation preventing layer 150 in the vicinity of the leading end of the free end side of the bimorph portion 108. The mirror element 300 may have the mirror 302 on the surface of the high, expansion coefficient layer 130 in the vicinity of the leading end of the free end side of the bimorph portion 108. The mirror 302 is formed by depositing metal such as chrome with a high reflectance ratio by means of sputtering or vapor deposition. The mirror element 300 reflects signal light incident on the mirror 302 according to a direction of the mirror 302. The mirror element 300 changes an amount of curvature of the bimorph portion 108 in accordance with electric power input through the heater electrode 112 to change a reflection direction of signal light.

The mirror element 300 of the present embodiment has a deformation preventing layer 150 on the surface of a silicon oxide layer 106 in the bimorph portion 108. In the mirror element 300, the deformation preventing layer 150 may be a metal film such as copper, gold, or aluminium. The metal film is finer than the silicon oxide layer 106, and thus surely blocks moisture and oxygen from the silicon oxide layer 106. The mirror element 300 can prevent the bimorph portion 108 from being deformed according to variation per hour due to the existence of the deformation preventing layer 150 as described above. Therefore, it is possible to improve the precision of reflection direction of signal light in the mirror 302 and further reduce fluctuation of electric power every device, in which the electric power is necessary to change this reflection direction to a desired direction.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

According to the bimorph element, the bimorph switch, the mirror element, and a method for manufacturing these, it is possible to prevent the shape of bimorph element from being changed over time.

What is claimed is:

1. A bimorph element comprising:
   a silicon oxide layer;
   a high expansion coefficient layer that is formed on the silicon oxide layer and has a thermal expansion coefficient higher than a thermal expansion coefficient of the silicon oxide layer; and
   a deformation preventing film that is formed by depositing silicon oxide under plasma CVD using energy higher than that used in the silicon oxide layer forming step and covers a surface of the silicon oxide layer and prevents the silicon oxide layer from being deformed over time.

2. The bimorph element as claimed in claim 1, wherein the deformation preventing film has a transmission factor of moisture and oxygen lower than that of the silicon oxide layer.

3. The bimorph element as claimed in claim 1, wherein the deformation preventing film is a silicon oxide film that is formed with energy higher than that used in a case that forms the silicon oxide layer.

4. The bimorph element as claimed in claim 1, wherein the deformation preventing film is a silicon nitride film.

5. The bimorph element as claimed in claim 1, wherein the deformation preventing film is a metallic film.

6. The bimorph element as claimed in claim 1, wherein the high expansion coefficient layer consists of copper.

7. A bimorph switch including a circuit substrate and a bimorph element, the circuit substrate having a fixed contact thereon, the bimorph element comprising:
   a silicon oxide layer;
   a high expansion coefficient layer That is formed on the silicon oxide layer and has a thermal expansion coefficient higher than a thermal expansion coefficient of the silicon oxide layer;

a deformation preventing film that is formed by depositing silicon oxide under plasma CVD using energy higher than that used in the silicon oxide layer forming step and covers a surface of the silicon oxide layer and prevents the silicon oxide layer from being deformed over time;

a traveling contact that is provided opposite the fixed contact, and the traveling contact being electrically connected to the fixed contact when the heater heats the high expansion coefficient layer and the silicon oxide layer.

8. A minor element including a bimorph element, the bimorph element comprising:

a silicon oxide layer;

a high expansion coefficient layer that is formed on the silicon oxide layer and has a thermal expansion coefficient higher than a thermal expansion coefficient of the silicon oxide layer;

a deformation preventing film that is formed by depositing silicon oxide under plasma CVD using energy higher than that used in the silicon oxide layer forming step and covers a surface of the silicon oxide layer and prevents the silicon oxide layer from being deformed over time;

a heater that heats the high expansion coefficient layer and the silicon oxide layer; and a mirror that reflects light, the mirror being provided at a position of which a direction is changed on a surface of the bimorph element when the heater heats the high expansion coefficient layer and the silicon oxide layer.

* * * * *

UNITED STATES PATENT AND TRADEMARK OFFICE
CERTIFICATE OF CORRECTION

| | |
|---|---|
| PATENT NO. | : 7,477,003 B2 |
| APPLICATION NO. | : 11/681038 |
| DATED | : January 13, 2009 |
| INVENTOR(S) | : Fumikazu Takayanagi |

It is certified that error appears in the above-identified patent and that said Letters Patent is hereby corrected as shown below:

In the Claims:

In Claim 8, column 9, line 10, the word, "minor" should be --mirror--.

Signed and Sealed this

Seventeenth Day of March, 2009

JOHN DOLL
*Acting Director of the United States Patent and Trademark Office*